United States Patent
Leone et al.

(10) Patent No.: US 11,996,287 B2
(45) Date of Patent: May 28, 2024

(54) METHOD AND APPARATUS FOR MANUFACTURING A SEMICONDUCTOR LAYER AND SUBSTRATE PROVIDED THEREWITH

(71) Applicants: Albert-Ludwigs-Universität Freiburg, Freiburg (DE); Fraunhofer-Gesellschaft zur Förderung der angewandten Forschung e.V., Munich (DE)

(72) Inventors: Stefano Leone, Freiburg (DE); Christian Manz, Freiburg (DE); Hanspeter Menner, Freiburg (DE); Joachim Wiegert, Freiburg (DE); Jana Ligl, Freiburg (DE)

(73) Assignees: Albert-Ludwigs-Universität Freiburg, Freiburg (DE); Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 101 days.

(21) Appl. No.: 17/004,302

(22) Filed: Aug. 27, 2020

(65) Prior Publication Data
US 2021/0066070 A1     Mar. 4, 2021

(30) Foreign Application Priority Data

Aug. 27, 2019  (DE) .................... 10 2019 212 821.1
Apr. 2, 2020   (DE) .................... 10 2020 204 294.2

(51) Int. Cl.
*H01L 21/02*     (2006.01)
*C23C 16/30*     (2006.01)
(Continued)

(52) U.S. Cl.
CPC ........ *H01L 21/0254* (2013.01); *C23C 16/303* (2013.01); *C23C 16/4482* (2013.01);
(Continued)

(58) Field of Classification Search
CPC ............. C23C 16/303; C23C 16/4482; H01L 21/0254; H01L 21/0262; H01L 29/2003; H01L 29/205
See application file for complete search history.

(56) References Cited

U.S. PATENT DOCUMENTS 4,439,267 A * 3/1984 Jackson, Jr. ............ C30B 29/48
                                                          117/102
4,650,539 A * 3/1987 Irvine .................... C30B 25/02
                                                          118/102

(Continued)

FOREIGN PATENT DOCUMENTS

| CN | 101736400 A | 6/2010 |
| CN | 108110054 A | 6/2018 |
| CN | 108899403 A | 11/2018 |

OTHER PUBLICATIONS

Leone et al., "Metal-Organic Chemical Vapor Deposition of Aluminum Scandium Nitride", Phys. Status Solidi, Rapid Research Letters, 1900535 (2019) (6 pages).

(Continued)

*Primary Examiner* — Jay C Kim
(74) *Attorney, Agent, or Firm* — Kevin P. Radigan, Esq.; Heslin Rothenberg Farley & Mesiti P.C.

(57) ABSTRACT

A semiconductor layer and a method and an apparatus for its manufacturing are disclosed. The semiconductor layer includes at least one compound of the formula $M^1_a M^2_{1-a} N$, where $M^1$ is selected from group 13 of the periodic table and $M^2$ is selected from the group comprising scandium, yttrium, erbium, and europium and where the parameter a is selected between 0.01 and 0.99. The method includes supplying a (Continued)

first precursor into a reaction chamber, the first precursor including at least $M^2$ and being supplied to the reaction chamber at a molar flow rate of at least $1 \cdot 10^{-6}$ mol/min by providing the first precursor by means of a first bubbler from which it is evaporated and supplied to the reaction chamber, the temperature of the first bubbler being more than 90° C.

8 Claims, 5 Drawing Sheets

(51) Int. Cl.
  *C23C 16/448* (2006.01)
  *H01L 29/20* (2006.01)
  *H01L 29/205* (2006.01)
(52) U.S. Cl.
  CPC ...... *H01L 21/0262* (2013.01); *H01L 29/2003* (2013.01); *H01L 29/205* (2013.01)

(56) References Cited

U.S. PATENT DOCUMENTS

| | | | | |
|---|---|---|---|---|
| 4,804,638 | A * | 2/1989 | Hoke | C30B 25/02 117/104 |
| 4,874,634 | A * | 10/1989 | Easton | C30B 29/48 427/584 |
| 4,904,337 | A * | 2/1990 | Elliott | C23C 16/482 117/103 |
| 5,438,952 | A * | 8/1995 | Otsuka | H01L 21/02395 257/E21.108 |
| 5,460,654 | A * | 10/1995 | Kikkawa | C23C 16/4485 118/726 |
| 5,572,052 | A * | 11/1996 | Kashihara | H01L 29/92 257/295 |
| 5,608,229 | A * | 3/1997 | Mukai | B82Y 20/00 257/14 |
| 5,821,155 | A * | 10/1998 | Izumi | H01L 21/02631 438/479 |
| 5,874,364 | A * | 2/1999 | Nakabayashi | H01L 27/10855 257/E21.586 |
| 5,882,416 | A * | 3/1999 | Van Buskirk | C23C 16/448 118/726 |
| 6,106,898 | A * | 8/2000 | Takamatsu | C23C 16/34 427/255.394 |
| 6,218,212 | B1 * | 4/2001 | Saito | C30B 25/14 438/93 |
| 6,271,077 | B1 * | 8/2001 | Nakabayashi | H01L 27/1085 438/738 |
| 6,271,498 | B1 * | 8/2001 | Miyake | C23C 16/4481 219/121 |
| 6,515,843 | B2 * | 2/2003 | Nakabayashi | H01L 27/1085 257/306 |
| 6,579,372 | B2 * | 6/2003 | Park | C23C 16/45561 118/715 |
| 6,649,218 | B2 * | 11/2003 | Qian | H01L 21/31604 426/255 |
| 7,464,917 | B2 * | 12/2008 | Lee | C23C 16/4482 261/DIG. 65 |
| 7,975,718 | B2 * | 7/2011 | Ngo | C23C 16/52 137/551 |
| 8,118,939 | B2 * | 2/2012 | Atlas | C23C 16/4482 261/DIG. 65 |
| 8,252,113 | B2 * | 8/2012 | Hatanaka | B05D 1/60 118/724 |
| 8,603,580 | B2 * | 12/2013 | Liu | C23C 16/4481 118/726 |
| 8,997,775 | B2 * | 4/2015 | Woelk | C23C 16/4481 137/89 |
| 9,096,930 | B2 * | 8/2015 | Doering | C23C 16/45512 |
| 9,598,993 | B2 * | 3/2017 | Younes | F01N 3/0885 |
| 9,957,612 | B2 * | 5/2018 | Woelk | B01D 1/14 |
| 10,141,209 | B2 * | 11/2018 | Itonaga | H01L 21/67017 |
| 10,214,817 | B2 * | 2/2019 | Takoudis | C23C 16/45553 |
| 10,343,907 | B2 * | 7/2019 | Jongbloed | C01B 15/017 |
| 10,363,497 | B2 * | 7/2019 | Spiegelman | B01D 63/068 |
| 10,408,742 | B2 * | 9/2019 | Nagase | G01N 21/33 |
| 10,927,462 | B2 * | 2/2021 | Nishizato | C23C 16/4481 |
| 10,968,364 | B2 * | 4/2021 | Jung | H01L 21/67115 |
| 2004/0203234 | A1 | 10/2004 | Pan et al. | |
| 2006/0240677 | A1 * | 10/2006 | Horii | H01L 21/02255 438/770 |
| 2006/0270222 | A1 * | 11/2006 | Yamoto | C23C 16/4407 438/681 |
| 2011/0237051 | A1 * | 9/2011 | Hess | H01J 37/3244 118/725 |
| 2012/0118231 | A1 * | 5/2012 | Takagi | C23C 16/407 118/733 |
| 2017/0362701 | A1 * | 12/2017 | Logue | C23C 16/448 |
| 2018/0204742 | A1 * | 7/2018 | Tateno | H01L 21/67017 |

OTHER PUBLICATIONS

Wang et al., "Study of Defects in GaN In Situ Doped with Eu3+ Ion Grown by OMVPE", Journal of Electronic Materials, vol. 45, No. 4, pp. 2001-2007 (2016).
Koleske et al., "Issues Associated with the Metalorganic Chemical Vapor Deposition of ScGaN and YGaN Alloys", Sandia National Laboratories, SAND2009-4419, printed Jul. 2009 (40 pages).
Saidi et al., "Growth of Scandium Doped GaN by MOVPE", Superlattices and Microstructures, vol. 60, pp. 120-128 (2013).
Flowlink, Internet Product Advertisement, printed/accessed Aug. 28, 2020 at: (https://www.flowlinksa.com/product-category/bellows-valves-3-4-ways-0) (2 pages).
Bronkhorst High-Tech B.V., "Metal Sealed Digital Mass Flow / Pressure Meters and Controllers", Product Brochure, Bht-T163394 (Downloaded/printed/accessed Aug. 31, 2020.) (4 pages).
Moram et al., "ScGaN and ScAlN: Emerging Nitride Materials", Journal of Materials Chemistry A, vol. 2, pp. 6042-6050 (2014).
Zhang et al., "Elastic Constants and Critical Thicknesses of ScGaN and ScAlN", Journal of Applied Physics, 114, 243516 (Dec. 2013) (7 pages).
Hoglund et al., "Wurtzite Structure Sc1-xAlxN Solid Solution Films Grown by Reactive Magnetron Sputter Epitaxy: Structural Characterization and First-Principles Calculations", Journal of Applied Physics, 107, 123515 (Jun. 2010) (8 pages).
Fichtner et al., "AlScN: A III-V Semiconductor Based Ferroelectric", Journal of Applied Physics, 125, 114103 (Mar. 2019) (8 pages).
Lu et al., "Surface Morphology and Microstructure of Pulsed DC Magnetron Sputtered Piezoelectric AlN and AlScN Thin Films", Physica Status Solidi A, Original Paper, 215, 1700559 (2018) (6 pages).
Ding et al., "Investigation of Temperature Characteristics and Substrate Influence of AlScN-Based SAW Resonators", Fhi fur Angewand te Festkorperphysik, IEEE Xplore (2018) (6 pages).
Frei et al., "Investifation of Growth Parameters for ScAlN-Battier HEMT Structures by Plasma-Assisted MBE", Japanese Journal of Applied Physics, 58, SC1045 (2019) (7 pages).
Hardy et al., "ScAlN: A Novel Barrier Material for High Power GaN-Based RF Transistors", ECS Transactions, 80 (7), pp. 161-168 (2017).
Hardy et al., "Epitaxial ScAlN Grown by Molecular Beam Epitaxy on GaN and SiC Substrates", Applied Physics Letters, 110, 162104 (Apr. 2017) (6 pages).
Kazior et al., "High Power Density ScAlN-Based Heterostructure FETs for mm-Wave Applications", IEEE/MTT-S International Microwave Symposium, pp. 1136-1139 (Jun. 2019).
Green et al., "ScAlN/GaN High-Electron-Mobility Transistors with 2.4-A/mm Current Density and 0.67-S/mm Transconductance", IEEE Electron Device Letters, vol. 40, No. 7, pp. 1056-1059 (Jul. 2019).
Edgar et al., "HVPE of Scandium Nitride on 6H-SiC(0001)", Journal of Crystal Growth, vol. 310, pp. 1075-1080 (2008).

(56) References Cited

OTHER PUBLICATIONS

Oshima et al., "Hydride Vapor Phase Epitaxy and Characterization of High-Quality ScN Epilayers", Journal of Applied Physics, 115, 153508 (Apr. 2014) (9 pages).

Blom et al., "Molecular Structures of tris(methylcyclopentadienyl)-scandium and -ytterbium as Studied by Gas Phase Electron Diffraction and Molecular Mechanics Calculations: The Scandium Atom is Too Small to Accommodate Three Pentahapto Cyclopentadienyl Rings", Journal of Organometallic Chemistry, vol. 462, pp. 131-139 (1993).

Cloke et al., "n-Arene Complexes of Scandium(0) and Scandium(II)", J. Chem. Soc., Chem. Commun., pp. 1372-1373 (1991).

King et al., "Metal-Ligand Bonding and Bonding Energetics in Zerovalent Lanthanide, Group 3, Group 4, and Group 6 Bes(arene) Sandwich Complexes. A Combined Solution Thermochemical and ab Initio Quantum Chemical Investigation", J. Am. Chem. Soc., vol. 118, pp. 627-635 (1996).

Milanov et al., "Homoleptic Gadolinium Guanidinate: A Single Source Precursor for Metal-Organic Chemical Vapor Deposition of Gadolinium Nitride Thin Films", J. Am. Chem. Soc., 131, pp. 17062-17063 (2009).

Krasnopolski, Michael, "Metalorganic Chemical Vapor Deposition (MOCVD) Routes for Fabrication of Rare Earth Nitride Thin Films: Precursor Evaluation, Thin Film Deposition and Characterization", Dissertation, Ruhr Universitat, Bochum, Germany (Jan. 2014) (285 pages).

Parsapour et al., "Ex-Situ AlN Seed Layer for (0001)-Textured Al0.84Sc0.16N Thin Films Grown on SiO2 Substrates", Sep. 2017 IEEE International Ultrasonics Symposium (IUS) (Year: 2017), 4 pages.

Tsui H C et al. "Valence band offsets of $Sc_xGa_{1-x}N$/AlN and $Sc_xGa_{1-x}N$/GaN heterojunctions" Journal of Physics D: Applied Physics, May 26, 2016, pp. 1-5, IOP Publishing, London, United Kingdom.

\* cited by examiner

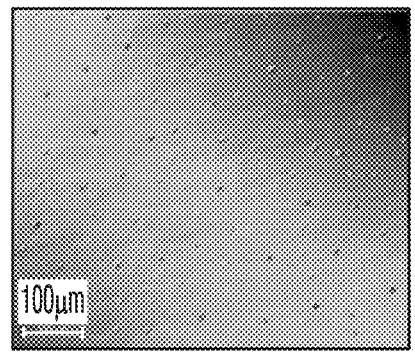
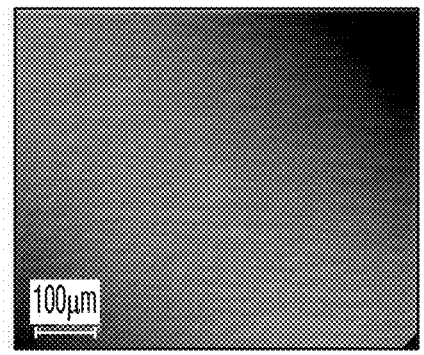
Fig. 3  Fig. 4
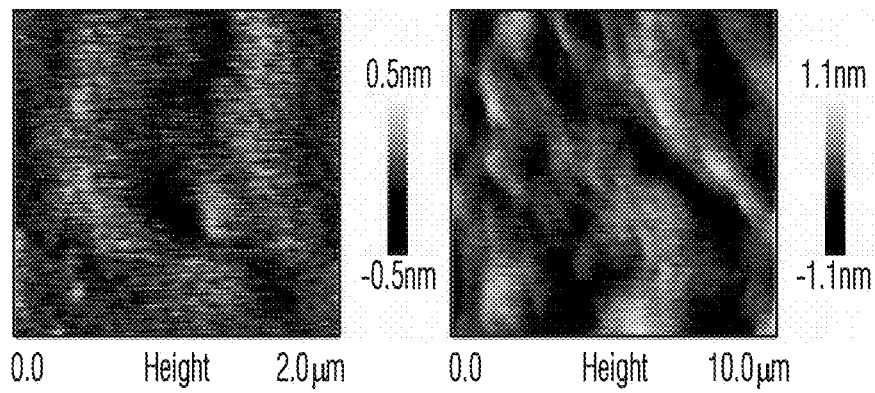
Fig. 5
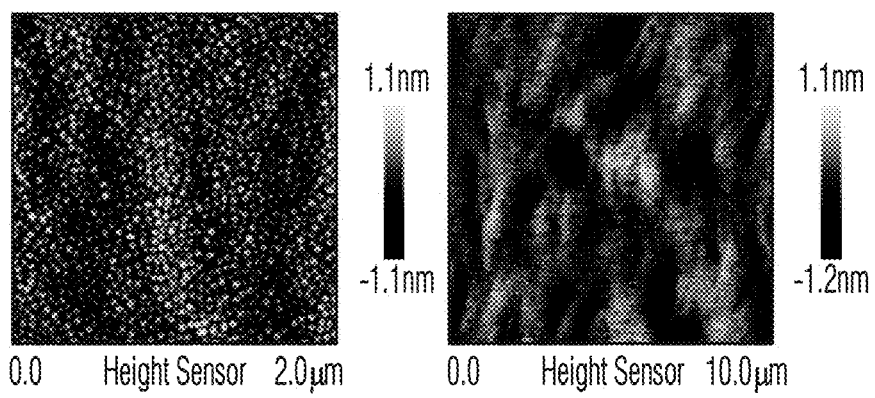
Fig. 6

METHOD AND APPARATUS FOR MANUFACTURING A SEMICONDUCTOR LAYER AND SUBSTRATE PROVIDED THEREWITH

CROSS-REFERENCE TO RELATED APPLICATIONS

This application claims priority under 35 USC § 119 to German Patent Application No. 10 2019 212 821.1, filed Aug. 27, 2019, which is hereby incorporated by reference. Furthermore, this application claims priority under 35 USC § 119 to German Patent Application No. 10 2020 204 294.2, filed Apr. 2, 2020, which is hereby incorporated by reference.

FIELD OF THE INVENTION

The invention relates to a semiconductor layer and a method and an apparatus for its manufacturing. The semiconductor layer comprises at least one compound of the formula $M^1{}_aM^2{}_{1-a}N$, wherein a is selected to be $0 \leq a < 1$. Such a semiconductor layer may be manufactured by metal-organic chemical vapor deposition (MOCVD), also called metal-organic vapor phase epitaxy (MOVPE). Semiconductor devices based on binary, ternary, or quaternary compounds from nitrogen and various elements of group 13 (formerly group IIIb (IUPAC) or group IIIa (CAS)) of the periodic table may be used for power electronic devices or optoelectronic devices.

SUMMARY OF THE INVENTION

According to one aspect of the invention, a method for manufacturing a semiconductor layer on a substrate by metal-organic vapor phase epitaxy is disclosed, wherein said semiconductor layer comprises at least one compound of the formula $M^1{}_aM^2{}_{1-a}N$, wherein $M^1$ is selected from group 13 of the periodic table and $M^2$ is selected from the group comprising scandium, yttrium, and other elements of group 3 and wherein the parameter a is selected between 0.01 and 0.99, said method comprising supplying a first precursor into a reaction chamber, said first precursor comprising at least $M^2$ and being supplied to the reaction chamber at a molar flow rate of at least $1 \cdot 10^{-6}$ mol/min, wherein said first precursor is provided by a first bubbler from which it is evaporated and supplied to the reaction chamber, the temperature of said first bubbler being more than 90° C.

According to another aspect of the invention, a substrate is disclosed comprising at least one heteroepitaxial layer and at least one semiconductor layer comprising at least one compound of the formula $M^1{}_aM^2{}_{1-a}N$, wherein $M^1$ is selected from group 13 of the periodic table of the elements and $M^2$ is selected from the group comprising scandium, yttrium, erbium, and other elements of group 3 and wherein the parameter a is selected between 0.01 and 0.99, said substrate comprising further at least one transition layer having a thickness from 10 nm to 20 nm and being arranged between the heteroepitaxial layer and the semiconductor layer.

According to still another aspect of the invention, an apparatus for manufacturing at least one semiconductor layer on at least one substrate by means of MOCVD is disclosed, said apparatus comprising at least one reaction chamber, at least one heatable substrate holder being arranged inside the reaction chamber, and at least one gas inlet into the reaction chamber, at least one first bubbler having an inlet and an outlet and a heater, wherein the outlet of the bubbler is connected to said gas inlet of said reaction chamber by means of at least one pipe, wherein said pipe is in thermal contact to at least one pipeline heater.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the devices, apparatuses, and methods. Advantages of embodiments of the systems, apparatuses, and methods will be apparent from the following detailed description of the exemplary embodiments thereof, which description should be considered in conjunction with the accompanying drawings in which:

FIG. 3 illustrates an optical microscopy image of an $Al_{0.775}Sc_{0.225}N$ epitaxial semiconductor layer according to the invention.

FIG. 4 illustrates an optical microscopy image of an $Al_{0.8}Sc_{0.2}N$ epitaxial semiconductor layer according to the invention.

FIG. 5 illustrates an AFM analysis of a $Ga_{0.999}Sc_{0.001}N$ semiconductor layer according to the invention.

FIG. 6 illustrates an AFM analysis of an $Al_{0.887}Sc_{0.113}N$ semiconductor layer according to the invention.

DETAILED DESCRIPTION

Figure 1:
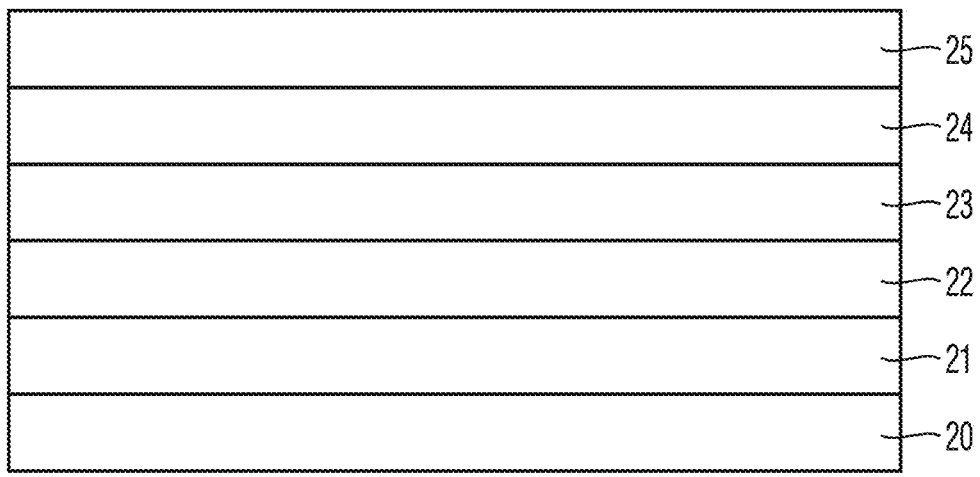
FIG. 1 illustrates an exemplary structure of a layer system obtainable by a method according to the invention.

As required, detailed embodiments of the devices, products, apparatuses, and methods are disclosed herein; however, it is to be understood that the disclosed embodiments are merely exemplary of the devices, products, apparatuses, and methods which can be embodied in various forms. Therefore, specific structural and functional details disclosed herein are not to be interpreted as limiting, but merely as a basis for the claims and as a representative basis for teaching one skilled in the art to variously employ the devices, products, apparatuses, and methods in virtually any appropriately detailed structure. Further, the terms and phrases used herein are not intended to be limiting; but rather, to provide an understandable description of the devices, products, apparatuses, and methods. While the specification concludes with claims defining the features of the devices, products, apparatuses, and methods that are regarded as novel, it is believed that the devices, products, apparatuses, and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the devices, products, apparatuses, and methods will not be described in detail or will be omitted so as not to obscure the relevant details of the systems, apparatuses, and methods.

Before the devices, products, apparatuses, and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, top/bottom, and proximal/distal. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. As used herein, the terms "substantial" and "substantially" means, when comparing various parts to one another, that the parts being compared are equal to or are so close enough in dimension that one skill in the art would consider the same. Substantial and substantially, as used herein, are not limited to a single dimension and specifically include a range of values for those parts being compared. The range of values, both above and below (e.g., "+/−" or greater/lesser or larger/smaller), includes a variance that one skilled in the art would know to be a reasonable tolerance for the parts mentioned.

Herein various embodiments of the systems, apparatuses, and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

According to one aspect of the invention, a method for manufacturing at least one semiconductor layer on a substrate by metal-organic chemical vapor deposition (MOCVD) is disclosed. In one embodiment, the semiconductor layer comprises at least one compound of the molecular formula $M^1_a M^2_{1-a} N$. In another embodiment, the semiconductor layer consists of a compound of the molecular formula $M^1_a M^2_{1-a} N$. In any case, $M^1$ stands for an element of group 13 of the periodic table of the elements and $M^2$ is selected from the group comprising scandium, yttrium, or any other element of group 3, such as erbium or europium. The amount of $M^2$ being present in the compound of the molecular formula $M^1_a M^2_{1-a} N$ may be selected from 1 at.-% up to 99 at.-%, i.e. $0.01 \le a < 0.99$.

While the method is carried out, said substrate is put into a reaction chamber and heated to an elevated temperature. While the method is carried out, at least a first precursor comprising or consisting of $M^2$ is supplied to the reaction chamber at least temporarily with a molar flow of at least $1 \cdot 10^{-6}$ mol/min. This feature has the effect that a compound or an alloy with the molecular formula $M^1_a M^2_{1-a} N$ with a high content of $M^2$ is obtained. Thus, the method according to the invention is capable of providing not only a group-13-nitride being doped with the element $M^2$ but a true compound or an alloy with the molecular formula $M^1_a M^2_{1-a} N$.

Within the meaning of the present description, a group 13 element refers to an element of the boron group or earth metals, i.e. in particular Ga, In and/or Al. Accordingly, an element of group 3 refers to an element of the scandium group or an element from the lanthanoid or the actinoid group. Within the present description, the groups of the periodic table are numbered with Arabic numerals 1 to 18 and thus follow the valid IUPAC convention.

In some embodiments of the invention, the semiconductor layer as defined above is an alloy made at least from elements $M^1$, $M^2$ and nitrogen. This feature may be a clear distinction of the invention from known semiconductor layers comprising a group-13-nitride and scandium as a dopant only. In some embodiments of the invention, the semiconductor layer as defined above is an epitaxial layer, i.e. the semiconductor layer is substantially monocrystalline. This feature may be a clear distinction of the invention from known semiconductor layers comprising $M^1_a M^2_{1-a} N$ but being polycrystalline. Such polycrystalline are obtainable by sputtering but do not provide the quality needed for the manufacturing of semiconductor devices.

According to another aspect of the invention, an apparatus for manufacturing at least one semiconductor layer by means of MOCVD or MOVPE is disclosed. Said apparatus comprises at least one reaction chamber. The reaction chamber may be made from a metal or an alloy such as stainless steel or aluminum or quartz. The reaction chamber may be sealed against atmospheric pressure such that a predeterminable pressure and a predeterminable gas composition may be provided inside the reaction chamber.

Furthermore, the apparatus for manufacturing at least one semiconductor layer may comprise at least one heatable substrate holder being arranged inside said reaction chamber and being adapted to receive at least one substrate to be coated. The heatable substrate holder may be configured to receive a single substrate only. In other embodiments, the heatable substrate holder may be configured to receive a plurality of substrates. In some embodiments, the heatable substrate holder may be configured to allow for a rotary movement of the substrate.

Furthermore, the apparatus for manufacturing at least one semiconductor layer may comprise at least one gas inlet. Said gas inlet is configured to receive a process gas or a mixture of different process gases and supply this process gas into the reaction chamber. A process gas may comprise at least one layer-forming substance or a precursor and a carrier gas. In other embodiments of the invention, a process gas may comprise an etching agent so that a chemical vapour etching step may be carried out on the substrate inside the reaction chamber.

The apparatus further comprises at least one first bubbler having an inlet and an outlet and a heater. The outlet of the bubbler is coupled to said gas inlet of said reaction chamber by means of at least one pipe. The bubbler is configured to receive at least one precursor which may be solid or liquid at room temperature. During operation of said bubbler, the precursor is heated by means of a dedicated heater of the bubbler such that the precursor is at least partly evaporated and supplied to said gas inlet by means of said pipe. The heater of the bubbler is configured to heat the precursor to more than about 90° C. In another embodiment, the heater of the bubbler is configured to heat the precursor to more than about 140° C. Finally, the apparatus comprises at least one pipeline heater which is in thermal contact to at least a part of said pipe. The pipeline heater is adapted to heat the pipe to more than about 90° C. in one embodiment. In another embodiment, the pipeline heater is adapted to heat the pipe to more than about 140° C. Thus, the structure of the first bubbler substantially corresponds to that of a gas washing bottle. Inside the bubbler, a saturated vapor of the first precursor is formed above the liquid or solid material of the first precursor. When a carrier gas is supplied to the inlet of the bubbler, said carrier gas flows through the bubbler to its outlet. The metal-organic compound is transported by the carrier gas through the outlet and into the reaction chamber where the semiconductor layer growth takes place on the substrate. In some embodiments of the invention, the carrier gas may be selected from hydrogen or nitrogen or an inert gas, e.g. a noble gas.

These features of the first bubbler described above provide a molar flow of more than about $1 \cdot 10^{-6}$ mol/min of the first precursor which allows for the production of semiconductor layers of high crystal quality and a high $M^2$ content (1−a) of more than about 0.01 or more than about 0.05 or more than about 0.1 or more than about 0.2 or more than about 0.3.

The apparatus may comprise further additional bubblers of a more conventional design to provide precursors for the element $M^1$ to the gas inlet of the reaction chamber.

The at least one first precursor can be solid or liquid. In some embodiments, it may have a vapor pressure of less than or equal to about 0.1 mmHg or about 0.13 mbar at room temperature.

In some embodiments, at least one metal-organic compound is used as the first precursor for the at least one metal $M^2$ of group 3. In some embodiments of the invention, this metal-organic compound can be supplied from at least one first bubbler.

In some embodiments of the invention, the bubbler containing the first precursor for $M^2$ is heated to a temperature of more than about 90° C. In other embodiments of the invention, the bubbler containing the first precursor can be heated to a temperature ranging from about 120° C. to about 200° C. In still another embodiment of the invention, the bubbler containing the first precursor can be heated to a temperature ranging from about 150° C. to about 200° C. In still another embodiment of the invention, the bubbler containing the first precursor can be heated to a temperature ranging from about 150° C. to about 175° C. The temperature ranges disclosed allow for a molar flow of more than $10^{-6}$ mol/min, which in turn allows to incorporate the large amounts of $M^2$ into the semiconductor layer as described by the present invention.

In some embodiments of the invention, the heater of the bubbler may comprise a heat transfer medium. Said heat transfer medium may comprise a liquid or a gas. A liquid may comprise any of water or a liquid metal or a liquid alloy or a thermal oil. A gas may comprise any of air or an inert gas such as nitrogen or a noble gas. The first bubbler may be in thermal contact to this heat transfer medium such that the first precursor is substantially held at the temperature of said heat transfer medium. In some embodiments of the invention, the heat transfer medium may be heated my means of an electric resistance heating. The heater may be comprise an open-loop or closed-loop control system to reduce or avoid deviations of the actual temperature from the setpoint temperature.

In some embodiments, the heater of the bubbler may comprise a bath with a liquid heat transfer medium. In other embodiments of the invention, the heater of the bubbler may comprise a heating cabinet, the interior of which is adapted to receive the bubbler. The interior of the heating cabinet may comprise a gas as a heat transfer medium. In some embodiments, the pressure in the interior of the heating cabinet can be atmospheric pressure. In other embodiments, the pressure in the interior of the heating cabinet can be selected to be lower than atmospheric pressure. In still another embodiment, the pressure in the interior of the heating cabinet can be selected to be higher than atmospheric pressure.

The outlet of the bubbler is coupled to said gas inlet of said reaction chamber by means of at least one pipe. As explained previously, the apparatus comprises at least one pipeline heater which is in thermal contact to at least a part of said pipe. In some embodiments of the method according to the invention, at least the temperature of the pipe connecting the first bubbler containing the first precursor to the reaction chamber is heated to a temperature of between about 120° C. and about 200° C. In another embodiment of the method according to the invention, at least the temperature of the pipe connecting the first bubbler containing the first precursor to the reaction chamber is heated to a temperature of between about 150° C. and about 200°. In still other embodiment of the invention, at least the temperature of the pipe connecting the first bubbler containing the first precursor to the reaction chamber is heated to a temperature of between about 150° C. and about 175° C. In still other embodiment of the invention, at least the temperature of the pipe connecting the first bubbler containing the first precursor to the reaction chamber is heated to a temperature of between about 120° C. and about 160° C.

In some embodiments of the invention, at least the temperature of the pipe connecting the first bubbler containing the first precursor to the gas inlet is heated to a temperature that substantially corresponds to the temperature of the first bubbler with an offset ranging from +0° C. to +50° C. or from +0° C. to +10° C. or from +0° C. to +5° C. or from +0° C. to +30° C. or from +5° C. to +50° C.

In some embodiments of the invention, the pipeline heater may comprise a resistance heater being in thermal contact with at least a part of the length of said pipe. In other embodiments, the pipeline heater may comprise an outer pipeline surrounding said pipe and comprising a heat transfer liquid filling the gap between the outer pipeline and the pipe. The pipeline heater may comprise further an open-loop or closed-loop control system to reduce or avoid deviations of the actual temperature of the pipe from the desired setpoint temperature.

In some embodiments of the invention, the pipe may be arranged concentrically inside the outer pipeline surrounding said pipe. This feature allows for the heat transfer liquid to flow in the gap and homogeneously heat the pipe so that a uniform temperature profile of the pipe is ensured even if the pipe is made of a material with poor thermal conductivity, such as glass or plastics or stainless steel. Both the pipe for the precursor and the outer pipeline for the heat transfer liquid may be designed as a rigid pipe or as a flexible tube or in sections of different designs.

In some embodiments of the invention, spacers may be arranged between the outer side of the pipe and the inner side of the outer pipeline. This prevents thermal bridges so that the wall of the pipe is heated homogeneously and condensation of the precursor in the pipe is prevented or reduced.

In some embodiments of the invention, the heat transfer liquid may be selected from the group comprising water, steam, and a thermal oil. In some embodiments of the invention, a heat transfer liquid may be circulated through the pipeline by means of a pump. In some embodiments of the invention, a heat transfer liquid may be circulated through the pipeline at a pressure above ambient pressure. This feature may allow for an increase of the boiling point, so that the pipeline heater may be operated at a higher temperature. In some embodiments of the invention, the heat transfer liquid may be circulated through the outer pipeline at a pressure of about 950 mbar to about 1400 mbar. In other embodiments of the invention, the heat transfer liquid may be circulated through the outer pipeline at a pressure of about 1000 mbar to about 1300 mbar In some embodiments of the invention, the pressure in the pipe connecting the first bubbler containing the first precursor to the gas inlet can be selected to be more than about 0.15 bar. In other embodiments of the invention, the pressure in the pipe connecting the first bubbler containing the first precursor to the gas inlet can be selected to be in the range from about 0.15 bar to about 0.3 bar. In still another embodiment of the invention, the pressure in the pipe connecting the first bubbler containing the first precursor to the gas inlet can be selected to be in the range from about 0.17 bar to about 0.26 bar. In still another embodiment of the invention, the pressure in the pipe connecting the first bubbler containing the first precursor to the gas inlet can be selected to be in the range from about 0.05 bar to about 1 bar In known apparatuses for carrying out a MOCVD or MOVPE method, the pipes which couple the bubblers to the reaction chamber are usually provided with mass flow controllers and/or pressure controllers and/or valves and/or gas injection systems which allow a precise control of the amount of the precursors supplied to the reaction chamber, thus ensuring a high reproducibility of the epitaxial growth process. Since in some embodiments of the invention the first bubbler and, where applicable, the pipe coupling the outlet of the first bubbler to the gas supply for the first precursor is heated to a temperature of more than about 90° C., known components cannot be used. At present, no components are known which are able to withstand temperatures above 70° C. or even above 120° C. In some embodiments of the invention, mechanical and/or pneumatic valves are used instead which do not have any electronic components that are affected by high temperatures.

In some embodiments of the invention, the total pressure $p_{total}$ within the bubbler can be measured or set to an upper limit value by means of a spring valve. Together with the flow of the carrier gas $\dot{V}$ and the partial pressure $p_{sc}$ of the first precursor used for the element $M^2$, the molar flow $\dot{n}$ of the first precursor can be measured or controlled without the need to use a mass flow controller in the hot zone of the bubbler or the pipe.

The molar flow $\dot{n}$ of the first precursor can be determined in some embodiments of the invention by the following formula:

$$\dot{n} = \frac{p_{total} \cdot \dot{V} \cdot \frac{p_{sc}}{p_{total}}}{R \cdot T}$$

wherein $\dot{V}$ denotes the flow of the carrier gas, $p_{sc}$ the partial pressure of the first precursor, $p_{total}$ the total pressure within the bubbler resulting from the evaporated precursor mixed with the carrier gas, T the temperature of the bubbler and R the universal gas constant. The temperature T of the bubbler and the flow $\dot{V}$ of the carrier gas may be measured and/or controlled by dedicated open-loop or closed-loop control devices. The total pressure $p_{total}$ can be measured, for example by a capacitive manometer or a spring manometer. The partial pressure $p_{sc}$ of the first precursor can be determined from the temperature T of the bubbler if the vapor pressure curve is known or has been determined for the precursor used. The vapor pressure curve can be determined experimentally in a way known per se or approximate data of a similar compound can be used.

In some embodiments, the at least one pipe coupling the outlet of the bubbler to the gas inlet of said reaction chamber comprises a pressure gauge. The pressure gauge may be used to check the total pressure resulting from the evaporated precursor mixed with the carrier gas in the pipe and, where applicable, to adjust it to a predefined setpoint by controlling the carrier gas flow by means of a valve and an open-loop or closed-loop control device.

In some embodiments, the at least one pipe coupling the outlet of the bubbler to the gas inlet of said reaction chamber has at least one valve. Said valve may be selected from any of a check valve, a needle valve, a metering valve, or a pneumatic valve. A check valve may prevent contamination of the first bubbler by backflow of other gases, for example carrier gas and other precursors, into the pipe or the bubbler for the first precursor.

In some embodiments of the invention, $M^1$ is selected from the group comprising aluminum, indium, and gallium. Thus, a method according to the invention may be used for manufacturing semiconductor layers or multilayer structures for optoelectronics or power electronics. In some embodiments of the invention, at least one semiconductor layer may comprise any of ScN, $Al_aSc_{1-a}N$, $Ga_aSc_{1-a}N$, $Al_aY_{1-a}N$, $Al_aEu_{1-a}N$ and $Al_aEr_{1-a}N$, wherein a is selected as described.

In some embodiments, the semiconductor layer according to the invention comprises further a metal $M^3$ being selected from group 3 or group 13 of the periodic table, such that the layer comprises at least one compound of the formula $M^1_aM^3_bM^2_{1-a-b}N$, wherein the parameter b is selected between 0.0 and 0.99, and wherein 1−a−b is >0 and $M^2$ is an element of group 3 or the group of the actinoids or the group of the lanthanoids of the periodic table and 0≤a<0.99. In some embodiments, 1−a−b is greater than 0.05. In some embodiments, 1−a−b is greater than 0.1. For example, such a semiconductor layer may comprise or consist of GaScYN or InGaScN.

For carrying out the invention, any uncoated or coated substrate or wafer can be used. In some embodiments, the substrate may comprise or consist of any of sapphire, silicon and/or silicon carbide and/or aluminium nitride and/or gallium nitride. The substrate may be coated with any of a buffer layer or a nucleation layer. The substrate may have a round shape with a diameter of more than 50 mm or more than 75 mm or more than 100 mm or more than 150 mm.

In some embodiments, the substrate may be heated to an elevated temperature at least while depositing the semiconductor layer. In some embodiments, the substrate may be heated to a temperature between about 700° C. and about 1400° C. In other embodiments, the substrate may be heated to a temperature between about 900° C. and about 1300° C. In still other embodiments, the substrate may be heated to a temperature between about 700° C. and about 1300° C. In still other embodiments, the substrate may be heated to a temperature between about 1000° C. and about 1300° C.

In some embodiments, the semiconductor layer may be deposited with a growth rate from about 0.02 nm/s to about 0.15 nm/s. In some embodiments, the semiconductor layer may be deposited with a growth rate from about 0.01 nm/s to about 0.5 nm/s. In some embodiments, the method according to the invention allows the manufacturing of a complete HEMT structure in about 2.5 h to about 4 h. In some embodiments, the method according to the invention allows the manufacturing of a complete HEMT structure in about 2.75 h to about 3.5 h. Thus, the method according to the invention using MOVPE deposition is much faster than known methods using MBE deposition.

In some embodiments of the invention, the quality of the semiconductor layer can be determined by the width of the Bragg reflection peak in the omega scan. In some embodiments, this width may be between about 0.01° and about 0.3° or between about 0.03° and about 0.07° FWHM.

In some embodiments of the invention, the semiconductor layer may be deposited homoepitaxially. In some embodiments of the invention, the semiconductor layer may be deposited heteroepitaxially. In some embodiments of the invention, multilayer systems or superlattices may be manufactured from semiconductor layers of different composition, each of which contains or consists of a different binary or ternary or quaternary compound of at least one element of group 13 and nitrogen. In some exemplary embodiments of the invention, multilayers or heterojunctions may comprise at least two layers of different compositions, each of which crystallizes in wurtzite structure and has a different band gap energy. For example, multilayers or layer systems of GaN/AlScN or InGaN/AlScN or GaN/AlYN or AlGaN/AlScN or AlGaN/AlYN can be manufactured. In some embodiments, a two-dimensional electron gas may be obtained at the interface of these multilayers or layer systems.

In some embodiments of the invention, the total pressure inside the reaction chamber may be between about 40 mbar and about 150 mbar while the semiconductor layer comprising any of $M^1_aM^3_bM^2_{1-a-b}N$ or $M^1_aM^2_{1-a}N$ is deposited. In other embodiments of the invention, the total pressure inside the reaction chamber may be between about 30 mbar and about 600 mbar while the semiconductor layer comprising any of $M^1_aM^3_bM^2_{1-a-b}N$ or $M^1_aM^2_{1-a}N$ is deposited.

In some embodiments of the invention, the parameter a may be selected such that 0.5≤a<0.99 applies. In other embodiments of the invention, the parameter a may be selected such that 0.5≤a<0.95 applies. In still other embodiments of the invention, the parameter a may be selected such that 0.5≤a≤0.90 applies. In still other embodiments of the invention, the parameter a may be selected such that 0.7≤a≤0.95 applies. In still other embodiments of the invention, the parameter a may be selected such that 0.7≤a≤0.9 applies. In still other embodiments of the invention, the parameter a may be selected such that 0.5≤a≤0.8 applies. In still other embodiments of the invention, the parameter a may be selected such that 0.8≤a≤0.95 applies.

In some embodiments of the invention, the first precursor may comprise the metal $M^2$, which is coordinated with two or more cyclopentadienyl rings (Cp), e.g. $Cp_3Sc$. In other embodiments of the invention, the first precursor may comprise the metal $M^2$, which is coordinated with one cyclopentadienyl rings (Cp). In some embodiments, one or more of the cyclopentadienyl rings may be substituted with C1-C5 alkyl groups, e.g. methyl groups or n-butyl groups. In some embodiments, one or more of the cyclopentadienyl rings may be substituted with an element of group 17, e.g. chlorine. These precursors may have the advantage of a higher vapor pressure compared to molecules in which the metal atoms are coordinated with alkyl compounds, such as methyl or ethyl. The vapor pressure may be increased further by substituting one or more of the cyclopentadienyl rings with a C1-C5 alkyl group. $Cp_3Sc$ or the corresponding methyl-substituted cyclopentadienyl $MeCp_3Sc$ are particularly useful if $M^2$ is selected to be scandium. In still other embodiments, the first precursor may comprise the metal $M^2$ coordinated by amidinate or guanidinate ligands, such as $C_{21}H_{45}ScN_6$(tris(N,N-di-prop-2-yl-formamidinato) scandium), or any other oxygen-free ligand.

The further constituents $M^1$ and N of the semiconductor layer can be supplied to the reaction chamber by additional bubblers each containing a suitable precursor. In some embodiments of the invention, the second precursor for adding nitrogen to the semiconductor layer may be selected from any of ammonia, hydrazine, phenylhydrazine, dimethylhydrazine and/or tertiary butylamine. In some embodiments of the invention, the third precursor for adding $M^1$ to the semiconductor layer may be selected from any of trimethylaluminum and/or triethylaluminum or trimethylgallium and/or triethylgallium. The handling of these precursors is known to a person skilled in the art, for example from the production of AlGaN, GaN and AlN semiconductor layers by means of a MOCVD method, so that the method according to the invention can easily be implemented in known MOCVD apparatuses.

In some embodiments, the invention relates to a semiconductor layer comprising any of $M^1_a M^3_b M^2_{1-a-b} N$ or $M^1_a M^2_{1-a} N$ which is obtainable by a method according to the invention. Such a semiconductor layer may be arranged on a substrate or a wafer and/or may be part of a multilayer system or a semiconductor heterostructure. The semiconductor layer according to the invention may be part of an optoelectronic device and/or an electronic device and/or an acousto-optical device and/or an acoustoelectronic device. In some embodiments of the invention, at least one semiconductor layer according to the invention may be a part of an active layer of a HEMT or an LED or a semiconductor laser or an optical detector. In some embodiments, the semiconductor layer comprising $M^1_a M^3_b M^2_{1-a-b} N$ or $M^1_a M^2_{1-a} N$ may be used as an etch-stop layer for the device processing of semiconductor heterostructures.

Described now are exemplary embodiments. Referring now to the figures of the drawings in detail and first, particularly to FIG. 1.

FIG. 1 illustrates a design of a semiconductor layer system according to the invention in more detail. In other designs, the sequence of the layers may be chosen differently, some layers may have a different composition, at least one additional layer may be present and/or some of the layers shown may be omitted.

The semiconductor layer system according to the invention as shown in FIG. 1 is manufacture on a wafer or a substrate 20. The substrate 20 may comprise or consist of sapphire. In other embodiments of the invention, the the substrate 20 may comprise or consist of any of Si, SiC, AlN, or GaN or another material not explicitly mentioned. The substrate 20 may comprise a monocrystalline material. In some embodiments of the invention, the substrate may be coated to achieve certain properties. Such a coating may include any of a buffer layer or a passivation layer or a nucleation layer.

As can be seen in FIG. 1, an optional nucleation layer 21 is deposited on the substrate 20 by means of MOCVD or MOVPE. This nucleation layer may comprise GaN or AlN or $Al_x Ga_{1-x} N$ with $0.01 < x < 0.99$ and may optionally be doped with iron. The nucleation layer may have a thickness of about 2 μm.

The illustrative embodiment in FIG. 1 includes a buffer layer 22 which is deposited on the nucleation layer 21. The buffer layer 22 may comprise GaN as well. The buffer layer may have a thickness of about 200 nm. In other embodiments, the buffer layer may have a thickness of about 20 nm to about 50 nm.

Next, an optional heteroepitaxial layer 23 is deposited on the buffer layer 22. The heteroepitaxial layer 23 comprises AlN. On the heteroepitaxial layer 23, a semiconductor layer 24 is deposited. The semiconductor layer 24 comprises at least one compound of the formula $M^1_a M^2_{1-a} N$, e.g. $Al_a Sc_{1-a} N$ and has a thickness of about 20 nm. The scandium content $(1-a)$ of the semiconductor layer 24 may be selected to be greater than 0.01 in some embodiments. In other embodiments, the scandium content may be greater than 0.05 or greater than 0.1 or greater than 0.2. The heteroepitaxial layer 23 and the semiconductor layer 24 according to the invention both may have a wurtzite structure, but different band gap energies.

The final layer is a cap layer 25, which is deposited on the semiconductor layer 24 and may comprise any of GaN or AlN or $Si_3 N_4$ or $Al_x Ga_{1-x} N$ with $0.01 < x < 0.99$. The cap layer may have a thickness of about 3 nm. In other embodiments, the cap layer may have a thickness of about 0.1 nm to about 10 nm.

The layer system illustrated in FIG. 1 is to be understood exemplarily only. Of course, variations within the scope of the present invention may be derived from this illustrative embodiment depending on the intended use of the semiconductor device. For example, individual or all layers may be provided with optional dopants in order to obtain a predeterminable electrical conductivity. Additionally, further layers may be added which are not shown in FIG. 1, or some of the layers shown may also be omitted.

In some embodiments, a quantum well structure may be obtained by repeating the layer sequence comprising the layers 23 and 24 several times. In some embodiments, between approx. 10 and approx. 20 heteroepitaxial layers 23 and semiconductor layers 24 may be deposited alternately on top of one another. In other embodiments, between approx. 20 and approx. 30 heteroepitaxial layers 23 and semiconductor layers 24 may be deposited alternately on top of one another. In still other embodiments, between approx. 20 and approx. 50 heteroepitaxial layers 23 and semiconductor layers 24 may be deposited alternately on top of one another.

In some embodiments, different materials may be selected. For example, the semiconductor layer 24 may also comprise any of AlYN or GaScN or GaYN or InGaScN instead of AlScN. The heteroepitaxial layer may comprise any of GaN or AlGaN instead of AlN. The illustrative example shown in FIG. 1 is only intended to explain the basic concept of the invention.

Using an apparatus as described below in greater detail with reference to FIG. 7, the exemplary embodiments described below were carried out, some aspects of which are illustrated in FIGS. 2 to 6.

Epitaxial growth experiments for the deposition of $Al_a Sc_{1-a} N$ or $Ga_a Sc_{1-a} N$ semiconductor layers in a multi-wafer MOCVD reactor were made with either sapphire or silicon carbide substrates having a diameter of 4″ (101.6 mm). The typical structure consisted of a 1.5 μm GaN epitaxial layer on sapphire, followed by an AlScN or GaScN layer having a thickness of 50 nm-150 nm, which was finally coated with an AlN or GaN layer having a thickness of some few nm.

In other exemplary embodiments, $Al_a Sc_{1-a} N$ semiconductor layers were applied directly to a GaN layer which had a thickness of 50 nm and was deposited on an $Al_2 O_3$ substrate in order to carry out high-resolution X-ray diffraction analysis. The HRXRD measurements were made with a Cu radiation source and a two-beam Ge(220) monochromator, which provides Cu-Kα1 monochromatic radiation. The diffracted X-rays were analyzed with a triaxial Ge(220) analyzer.

The following exemplary embodiments show the epitaxial growth of $Al_aSc_{1-a}N$ and $Ga_aSc_{1-a}N$. Different epitaxial growth parameters, such as temperature, pressure, ratio of the molar flow of the precursor for nitrogen to the molar flow of the precursors for Al and Sc, were investigated. The composition of the AlScN semiconductor layers was analyzed by means of secondary ion mass spectrometry (SIMS), where $O^{2+}$ or $Cs^+$ ions with 5 keV energy were used as primary ion beam to identify different atoms (Sc, Al, Ga, N, C, O, . . . ) in the epitaxial layers. Optical microscopy with Nomarski differential interference contrast (NDIC) and atomic force microscopy in tapping mode (AFM) were used to assess the morphology of these layers.

1$^{st}$ Exemplary Embodiment

In a first exemplary embodiment, a multilayer system substantially as shown in FIG. 1 was manufactured by a MOCVD process according to the invention. The multilayer system comprises a nucleation layer 21, which comprises GaN, a buffer layer 22, a heteroepitaxial layer 23, which comprises AlN, a semiconductor layer 24 according to the invention $Al_aSc_{1-a}N$, and a cap layer 2, comprising AlN. The following table discloses the parameters used during manufacturing of the second part of the buffer layer 22, the heteroepitaxial layer 23, the semiconductor layer 24, and the cap layer 2, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers. The table below does not indicate the parameters used during manufacturing of the nucleation layer and the first part of the buffer layer which are known to those skilled in the art.

| Layer | Time [h:m:s] | Temp. [° C.] | Pressure [mbar] | MO [mol/min] | Sc [mol/min] | NH$_3$ [mol/min] |
|---|---|---|---|---|---|---|
| GaN (22) | 00:05:00 | 1180 | 200 | 1.67E−04 | 0 | 3.57E−01 |
| AlN (23) | 00:03:00 | 1000 | 40 | 2.28E−05 | 0 | 1.52E−02 |
| AlScN (24) | 01:30:00 | 1000 | 40 | 4.87E−06 | 3.60E−06 | 1.52E−02 |
| AlN (25) | 00:03:00 | 1000 | 40 | 2.28E−05 | 0 | 1.52E−02 |

Figure 2:
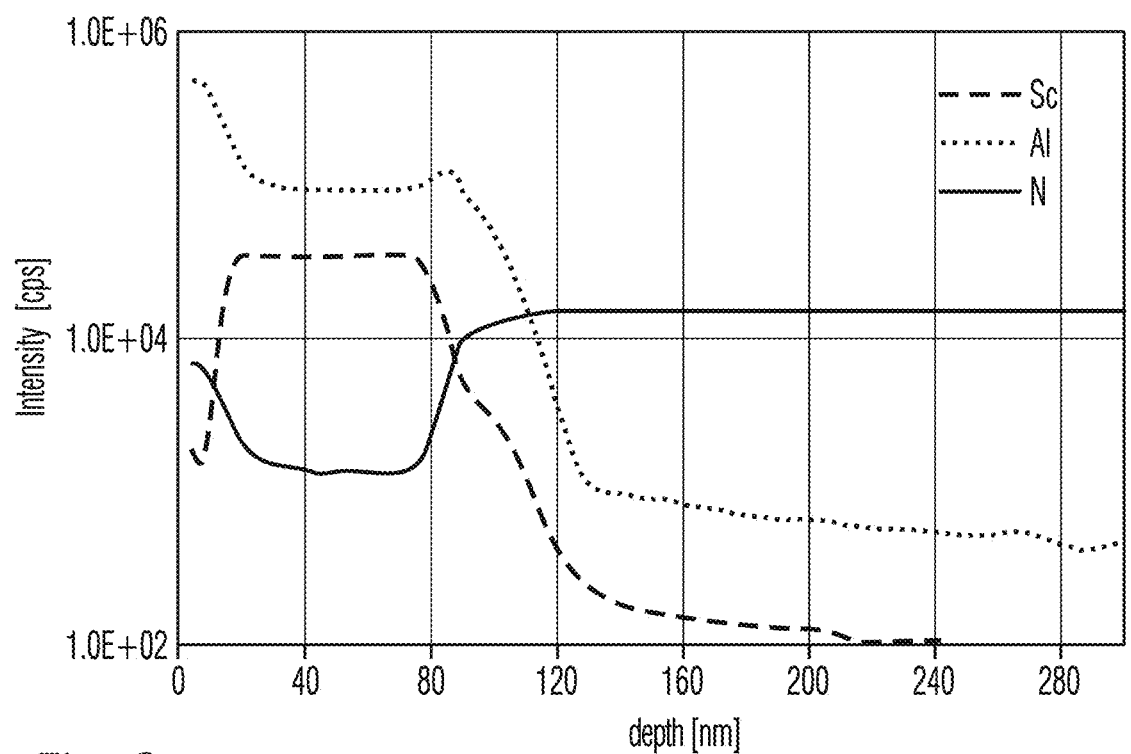
FIG. 2 illustrates a SIMS analysis of an $Al_aSc_{1-a}N$ semiconductor layer grown on a $GaN/Al_2O_3$ wafer, where the parameter a is 0.705.

FIG. 2 illustrates the result of a SIMS measurement on the above mentioned multilayer system. The semiconductor layer 24 according to the invention has an Sc content of 29.5%, i.e. the semiconductor layer 24 comprises $Al_{0.705}Sc_{0.295}N$. This concentration has not yet been obtained by MOCVD previously and it is clearly shown that the method according to the invention and the apparatus according to the invention is suitable to generate a high molar flow of $Cp_3Sc$ inside the reaction chamber. Thus, the inventors of the current invention demonstrated for the first time epitaxial growth of AlScN by means of MOCVD.

2$^{nd}$ Exemplary Embodiment

In a second exemplary embodiment, a multilayer system substantially as shown in FIG. 1 was manufactured by a MOCVD process according to the invention. The multilayer system comprises a nucleation layer 21, which comprises GaN, a buffer layer 22 comprising GaN, a heteroepitaxial layer 23, which comprises AlN, a semiconductor layer 24 according to the invention comprising $Al_{0.775}Sc_{0.225}N$, and a cap layer 2, comprising AlN. The following table discloses the parameters used during manufacturing of the second part of the buffer layer 22, the heteroepitaxial layer 23, the semiconductor layer 24, and the cap layer 2, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers. The table below does not indicate the parameters used during manufacturing of the nucleation layer and the first part of the buffer layer which are known to those skilled in the art.

| Layer | Time [h:m:s] | Temp. [° C.] | Pressure [mbar] | MO [mol/min] | Sc [mol/min] | NH$_3$ [mol/min] |
|---|---|---|---|---|---|---|
| GaN (22) | 00:05:00 | 1180 | 200 | 1.67E−04 | 0 | 3.57E−01 |
| AlN (23) | 00:03:00 | 1000 | 40 | 1.55E−05 | 0 | 1.52E−02 |
| AlScN (24) | 02:00:00 | 1000 | 40 | 4.87E−06 | 2.49E−06 | 1.52E−02 |
| AlN (25) | 00:03:00 | 1000 | 40 | 1.55E−05 | 0 | 1.52E02 |

FIG. 3 shows the result of an optical microscopy on the multilayer system obtained by the second exemplary embodiment. As can be seen in FIG. 3, a layer having a scandium content of 22.5% (i.e. $Al_{0.775}Sc_{0.225}N$) is manufactured as a crack-free layer with a thickness of more than 100 nm.

3$^{rd}$ Exemplary Embodiment

In a third exemplary embodiment, a multilayer system substantially as shown in FIG. 1 was manufactured by a MOCVD process according to the invention. The multilayer system comprises a nucleation layer 21, which comprises GaN and iron as a dopant, a buffer layer 22 comprising GaN, a heteroepitaxial layer 23, which comprises AlN, a semiconductor layer 24 according to the invention comprising $Al_{0.8}Sc_{0.2}N$, and a cap layer 2, comprising AlN. The following table discloses the parameters used during manufacturing of the nucleation layer 21, the buffer layer 22, the heteroepitaxial layer 23, the semiconductor layer 24, and the cap layer 2, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers.

| Layer | Time [m:s] | Temp. [° C.] | Pressure [mbar] | MO [mol/min] | Sc [mol/min] | NH$_3$ [mol/min] |
|---|---|---|---|---|---|---|
| GaN:Fe (21) | 20:00 | 1180 | 200 | 1.67E−04 | 0 | 3.57E−01 |
| GaN (22) | 40:00 | 1180 | 200 | 1.67E−04 | 0 | 3.57E−01 |
| AlN (23) | 00:30 | 1000 | 40 | 2.28E−05 | 0 | 4.90E−02 |
| AlScN (24) | 23:00 | 1000 | 40 | 4.87E−06 | 3.60E−06 | 4.90E−02 |
| GaN (25) | 00:20 | 1000 | 40 | 4.18E−05 | 0 | 1.78E−01 |

FIG. 4 shows the result of an optical microscopy on the multilayer system obtained by the third exemplary embodiment. As can be seen in FIG. 3, a layer having a scandium content of 20.0% (i.e. $Al_{0.8}Sc_{0.2}N$) is manufactured as a crack-free layer with a thickness of 20 nm.

4th Exemplary Embodiment

In a fourth exemplary embodiment, a multilayer system substantially as shown in FIG. 1 was manufactured by a MOCVD process according to the invention. The multilayer system comprises a nucleation layer 21, which comprises GaN, a buffer layer 22 comprising GaN, a heteroepitaxial layer 23, which comprises AlN, a semiconductor layer 24 according to the invention comprising $Ga_aSc_{1-a}N$, wherein a=0.999, and a cap layer 2, comprising AlN. The following table discloses the parameters used during manufacturing of the second part of the buffer layer 22, the heteroepitaxial layer 23, and the semiconductor layer 24, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers. The table below does not indicate the parameters used during manufacturing of the nucleation layer and the first part of the buffer layer which are known to those skilled in the art.

| Layer | Time [h:m:s] | Temp. [° C.] | Pressure [mbar] | MO [mol/min] | Sc [mol/min] | $NH_3$ [mol/min] |
|---|---|---|---|---|---|---|
| GaN (22) | 00:05:00 | 1180 | 200 | 1.67E−04 | 0 | 3.57E−01 |
| AlN (23) | 00:02:00 | 1000 | 40 | 2.28E−05 | 0 | 1.52E−02 |
| GaScN (24) | 02:00:00 | 1000 | 40 | 1.67E−05 | 3.60E−06 | 4.90E−02 |

FIG. 5 shows the result of an AFM measurement on the multilayer system obtained by the fourth exemplary embodiment. The measurement gives an RMS roughness of 0.33 nm over an area of 10 μm×10 μm. On a smaller area, namely an area of 2×2 μm², the RMS roughness amounts only 0.15 nm. The measurements confirm the high crystal quality of the $Ga_aSc_{1-a}N$ layer obtained by the present invention. The composition of the semiconductor layer 24 according to the fourth exemplary embodiment of the invention is $Ga_{0.999}Sc_{0.001}N$

5th Exemplary Embodiment

In a fifth exemplary embodiment, a semiconductor layer 24 comprising $Al_{0.887}Sc_{0.113}N$ was produced on a nucleation layer 21 comprising AlN. The buffer layer 22, the heteroepitaxial layer 23 and the cap layer 25 are omitted in this example. The following table shows the growth parameters for the nucleation layer 21 and the semiconductor layer 24, i.e. the growth time, the substrate temperature, the total pressure in the reaction chamber and the molar flow of the precursors, namely metal organics (MO, i.e. the precursor for Al), $Cp_3Sc$ (Sc) and $NH_3$ for each of the respective layers.

| Layer | Time [m:s] | Temp. [° C.] | Pressure [mbar] | MO [mol/min] | Sc [mol/min] | $NH_3$ [mol/min] |
|---|---|---|---|---|---|---|
| AlN (21) | 01:30 | 1000 | 40 | 2.28E−05 | 0 | 1.52E−02 |
| AlScN (24) | 90:00 | 1000 | 40 | 4.87E−06 | 1.68E−06 | 1.52E−02 |

The result of an AFM measurement is shown in FIG. 6. The measurement gives an RMS roughness of 0.33 nm over an area of 10 μm×10 μm. On a smaller area of 2×2 μm², the RMS roughness is 0.32 nm. The measurements confirm the high crystal quality of the layer thus obtained. The composition of the semiconductor layer 24 according to the invention is $Al_{0.887}Sc_{0.113}N$.

6th Exemplary Embodiment

In a sixth exemplary embodiment, a multilayer system substantially as shown in FIG. 1 was manufactured by a MOCVD process according to the invention on an $Al_2O_3$ substrate. The multilayer system comprises a nucleation layer 21, which comprises GaN, a buffer layer 22 comprising GaN, a heteroepitaxial layer 23, which comprises AlN, a semiconductor layer 24 according to the invention comprising $Al_{0.8}Sc_{0.2}N$, and a cap layer 2, comprising GaN. In the illustrated exemplary embodiment, the buffer layer 22 is composed of two layers, the partial layer closer to the substrate comprising further iron as a dopant. The following table discloses the parameters used during manufacturing of the nucleation layer 21, the buffer layer 22, the heteroepitaxial layer 23, the semiconductor layer 24, and the cap layer 2, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers. Pulsed growth is used in the production of the $Al_{0.8}Sc_{0.2}N$ semiconductor layer 24, i.e. the sources for Al and Sc are alternately opened and closed so that scandium is first introduced for 5 s and then aluminum is introduced for 2 s, the sequence being repeated cyclically until a layer thickness of 12 nm is reached.

| Layer | Time [m:s] | Temp. [° C.] | Pressure [mbar] | MO [mol/min] | Sc [mol/min] | $NH_3$ [mol/min] |
|---|---|---|---|---|---|---|
| GaN:Fe (22) | 20:00 | 1180 | 200 | 1.67E−04 | 0 | 3.57E−01 |
| GaN (22) | 40:00 | 1180 | 200 | 1.67E−04 | 0 | 3.57E−01 |
| AlN (23) | 00:30 | 1000 | 40 | 2.28E−05 | 0 | 4.90E−02 |
| AlScN (24) | 23:00 | 1000 | 40 | 4.87E−06 | 3.60E−06 | 4.90E−02 |
| GaN (25) | 00:20 | 1000 | 40 | 4.18E−05 | 0 | 1.78E−01 |

Figure 7:
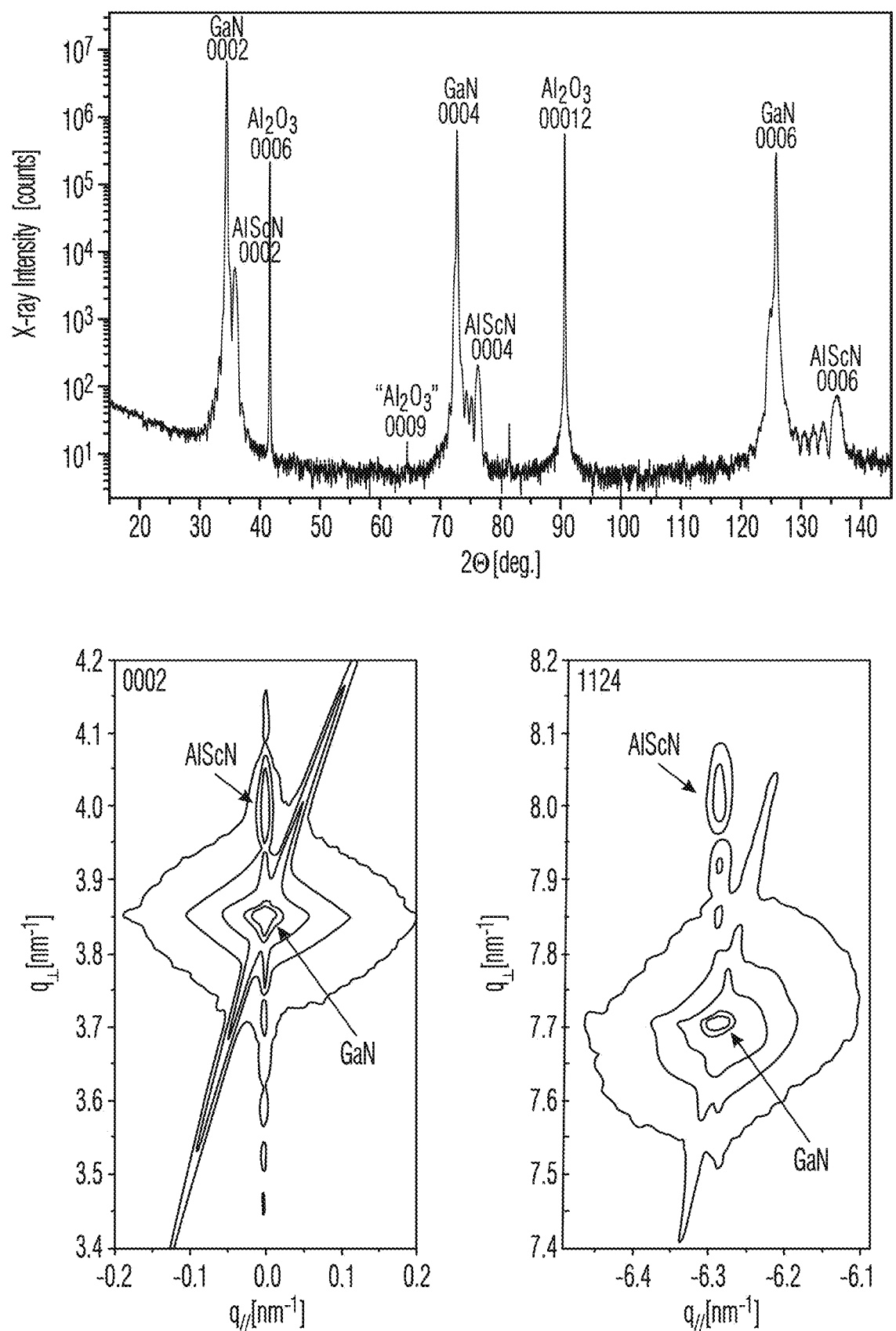
FIG. 7 illustrates an HRXRD analysis of an $Al_{0.8}Sc_{0.2}N$ semiconductor layer according to the invention which has a thickness of 300 nm and is deposited on a $GaN/Al_2O_3$ substrate.

An HRXRD measurement (High Resolution X-ray Diffraction) was carried out on the 12 nm $Al_{0.8}Sc_{0.2}N$ semiconductor layer 24 obtained in this way, the result of which is shown in FIG. 7. The phase analysis shows that pure wurtzite phase $Al_{0.8}Sc_{0.2}N$ with high crystal quality has been deposited. The high crystal quality is confirmed by the presence of sharp reflection peaks of the thin AlScN semiconductor layer for the reflection range 0002, 0004 and 0006.

In order to analyze the lattice parameter of the AlScN semiconductor layer 24, reciprocal spatial imaging measurements (RSMs) of the 0002 and the $\overline{1}\overline{1}24$ reflection regions were performed on the same sample. The estimated lattice constants for the AlScN semiconductor layer 24 are a=318.21 μm, and c=498.80 μm, and for the GaN buffer layer 22 they are a=318.21 μm and c=519.14 μm. The almost identical lattice parameter a of the AlScN semiconductor layer and the GaN buffer layer proves that pseudomorphic growth was achieved for the AlScN semiconductor layer by MOCVD. In addition, the RSM of both the 0002 and the 1̄ 1̄24 reflection ranges show well resolved reflection peaks, which confirm the high structural quality of the AlScN semiconductor layer.

7th Exemplary Embodiment

In a seventh exemplary embodiment, a multilayer system substantially as shown in FIG. 1 was manufactured by a MOCVD process according to the invention. The multilayer system comprises a nucleation layer 21, which comprises GaN and iron as a dopant, a buffer layer 22 comprising GaN, a heteroepitaxial layer 23, which comprises AlN, and a semiconductor layer 24 according to the invention comprising $Al_{0.05}Sc_{0.95}N$. The following table discloses the parameters used during manufacturing of the nucleation layer 21, the buffer layer 22, the heteroepitaxial layer 23, and the semiconductor layer 24, i.e. the growth time, the substrate temperature, the total pressure in the reaction chamber and the molar flow of the precursors, namely metal organics (MO, i.e. the precursors for Ga or Al), $Cp_3Sc$ (Sc) and $NH_3$ for each of the respective layers.

|  | Time [m:s] | Temp [° C.] | press [mbar] | MO flow [mol/min] | Sc Flow [mol/min] | $NH_3$ [mol/min] |
|---|---|---|---|---|---|---|
| GaN:Fe | 16:40 | 1180 | 200 | 1.67E−04 | 0 | 3.57E−01 |
| GaN | 09:20 | 1180 | 200 | 1.67E−04 | 0 | 3.57E−01 |
| AlN (23) | 01:00 | 1100 | 40 | 2.28E−05 | 0 | 3.10E−01 |
| ScN (24) | 60:00 | 1100 | 40 | 0 | 3.60E−06 | 3.10E−01 |

As confirmed by secondary ion mass spectroscopy (SIMS), the semiconductor layer 24 comprises $Al_{0.05}Sc_{0.95}N$, i.e. a scandium content of 95%. A higher scandium content up to 100%, i.e. growth of ScN, may be expected when a higher layer thickness is grown as the flow of MO is zero, i.e. the semiconductor layer 24 according to the seventh exemplary embodiment is nominally free of aluminum. However, a minor amount of Al has diffused into the outer layer. This thermal diffusion is a well-known phenomena in MOCVD.

8th Exemplary Embodiment

In an eighth exemplary embodiment, a semiconductor layer 24 comprising $Al_{0.44}Sc_{0.66}N$ was produced on a nucleation layer 21 comprising AlN. The buffer layer 22, the heteroepitaxial layer 23 and the cap layer 25 are omitted in this example. The following table shows the growth parameters for the nucleation layer 21 and the semiconductor layer 24, i.e. the growth time, the substrate temperature, the total pressure in the reaction chamber and the molar flow of the precursors, namely metal organics (MO, i.e. the precursor for Al), $Cp_3Sc$ (Sc) and $NH_3$ for each of the respective layers.

| Layer | Time [h:m:s] | Temp. [° C.] | Pressure [mbar] | MO [mol/min] | Sc [mol/min] | $NH_3$ [mol/min] |
|---|---|---|---|---|---|---|
| AlN (21) | 00:01:00 | 1200 | 40 | 2.28E−05 | 0 | 3.1E−02 |
| ScN (24) | 09:00:00 | 1200 | 40 | 0 | 3.6E−06 | 3.1E−02 |

The semiconductor layer 24 was intended to be pure ScN. Yet, due to the different growth conditions, the presence of aluminum on the reaction chamber walls and the typical thermal diffusion of aluminum in the nearby layers, the semiconductor layer (24) resulted to have an aluminum content up to 44%. Therefore, the layer 12 nm thick layer comprised $Al_{0.44}Sc_{0.66}N$, as measured by SIMS.

As may be seen from the exemplary embodiments, the successful epitaxial growth of $Al_aSc_{1-a}N$ and $Ga_aSc_{1-a}N$ semiconductor layers with 0.05<a<0.999 with high crystalline quality and good morphology is possible by means of the method and the apparatus according to the invention. Thus, power electronic devices and optoelectronic devices (emitters and detectors) on the basis of $M^1_aM^2_{1-a}N$ may be obtained by a MOCVD method according to the invention.

Figure 8:
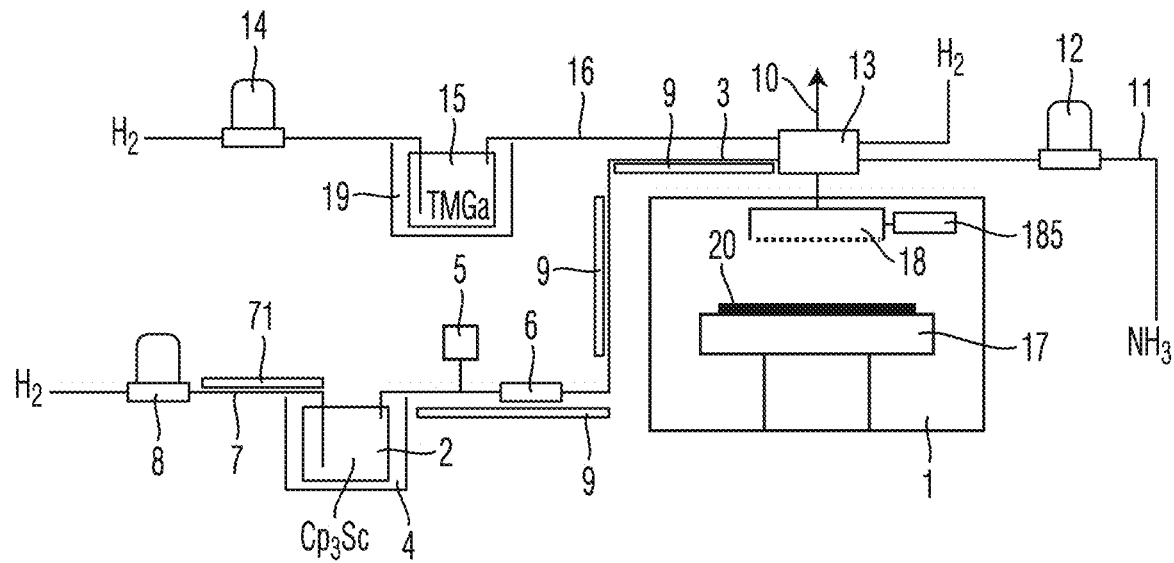
FIG. 8 illustrates a block diagram of an apparatus according to the invention in a first embodiment.

FIG. 8 illustrates a block diagram of a first embodiment of an apparatus according to the invention. The further explanation of the apparatus and its use is exemplified by the semiconductor compound $Al_aSc_{1-a}N$. The production of other compounds of the formula $M^1_aM^2_{1-a}N$ may be put into practice in an analogous way.

The apparatus according to the invention has a reaction chamber 1. The reaction chamber may have a wall made of an aluminum alloy or stainless steel or a ceramic material or quartz. The reaction chamber 1 may be designed to form a gas-tight enclosure in order to be evacuated by means of a vacuum pump not shown in the drawings. The reaction chamber may have a cover (not shown) or an opening so that substrates may be quickly unloaded from and loaded into the reaction chamber after completion of a single run of the method.

The apparatus comprises at least one substrate holder 17 being arranged inside the reaction chamber 1. The substrate holder 17 is adapted to hold at least one substrate 20. The substrate holder 17 may comprise at least one substrate heater being configured to heat the substrate to an elevated temperature, e.g. a temperature of about 700° C. to about 1400° C. In other embodiments of the invention or during certain method steps, the substrate may be heated to a temperature of about 900° C. to about 1300° C. In still other embodiments or during certain method steps, the substrate may be heated to a temperature of about 700° C. to about 1300° C. The substrate holder 17 may be configured to move or rotate the substrate inside the reaction chamber 1. Such a movement may provide for a more uniform deposition of the epitaxial layers. In some embodiments of the invention, the substrate holder may be configured to hold a plurality of substrates.

Furthermore, the reaction chamber 1 has at least one gas inlet 18. In different embodiments of the invention, the gas inlet 18 may have different designs, e.g. a vertical and/or a horizontal arrangement of nozzles and/or a shower head. In some embodiments of the invention, the gas inlet 18 may have a gas inlet heater 185 being configured to heated the gas inlet to an elevated temperature, e.g. more than about 80° C. or more than about 90° C. or more than about 110° C. The gas inlet heater 185 may comprise any of an induction heater or a resistance heater or a duct being flooded by a heat transfer medium which is kept at a predeterminable temperature under thermostatic control. The heat transfer medium may be selected from any of water, glycol, oil, gas, and/or steam.

Gaseous precursors may be supplied to the gas inlet 18 by means of a header line 13. The header line 13 serves for connecting several sources of precursors and carrier gases of the gas dosing system to the gas inlet 18 The header line 13 may comprise at least one switch valve which is configured to connect all or some of the pipes 3 for supplying the precursors temporarily to an exhaust gas line 10 and temporarily to the gas inlet 18. For example, the first precursor may be bleeded off the bubbler 2 as exhaust gas through the exhaust gas line 10 if no scandium is needed in the layer currently grown inside the reaction chamber 1.

The apparatus may comprise at least one bubbler 15 of a conventional design to provide precursors for the element $M^1$ to the gas inlet 18 of the reaction chamber 1. The precursors for the element $M^1$ may comprise at least one metal-organic compound, e.g. trimethylgallium (TMGa) or trimethylaluminum (TMAl). The bubbler 15 has an inlet and an outlet. The outlet of the bubbler is coupled to said gas inlet 18 of the reaction chamber 1 by means of at least one pipe. The bubbler is configured to receive at least one precursor which may be solid or liquid at room temperature. During operation of the bubbler 15 the precursor is at least partly evaporated such that inside the bubbler, a saturated vapor of the precursor is formed above the liquid or solid material of the precursor. When a carrier gas is supplied to the inlet of the bubbler, said carrier gas flows through the bubbler to its outlet. The metal-organic compound is transported by the carrier gas through the outlet and into the reaction chamber where the semiconductor layer growth takes place on the substrate. In some embodiments of the invention, the carrier gas may be selected from hydrogen or nitrogen or an inert gas, e.g. a noble gas. Thus, the structure of the bubbler substantially corresponds to that of a gas washing bottle.

During operation of the apparatus, the carrier gas may be supplied with a flow of about 0.01 slm to about 3 slm in some embodiments. In other embodiments, the carrier gas may be supplied with a flow of about 5 slm to about 10 slm. The flow of the carrier gas may be kept constant with a second mass flow controller 14 or may be regulated to pre-determined setpoints.

The bubbler 15 is in contact with a heating or cooling device 19, which may comprise any of a water or oil bath, the temperature of which may be regulated to a predeterminable setpoint. Common setpoints of temperature range from about −5° C. to about 50° C. With regard to TMGa, temperatures from −5 to 20° C. are common. With regard to other precursors, e.g. for Al or In, the typical temperature ranges from 10° C. to 20° C. For dopants, such as Mg or Fe, a temperature from 15° C. to 50° C. may be selected.

The molar flow of the precursors which is supplied to the reaction chamber via the pipe 16 may be controlled by the temperature of the heating or cooling device 19 and the flow of the carrier gas. In some embodiments, the pressure in the pipe 16 may be controlled by an electronic closed-loop or an open-loop pressure controller not shown in the drawings.

In the same way as described above, a plurality of similar bubblers 15 with associated mass flow controllers and pipes 16 may be available to supply different third precursors for the component $M^1$ or $M^3$ and optional dopants simultaneously or sequentially to the reaction chamber 1 by means of the gas supply 18.

In addition, ammonia may be supplied to the reaction chamber in gaseous form as a second precursor for nitrogen via a first mass flow controller 12 and the nitrogen line 11. Furthermore, hydrogen and/or nitrogen and/or a noble gas may be supplied at least temporarily to the reaction chamber as a carrier gas or as a purge gas.

The apparatus further comprises at least one first bubbler 2 having an inlet and an outlet and a heater 4. The outlet of the bubbler is coupled to the gas inlet 18 of the reaction chamber 1 by means of at least one pipe 3. The bubbler 2 is configured to receive at least one precursor which may be solid or liquid at room temperature. During operation of said bubbler, the precursor is heated by means of a dedicated heater 4 of the bubbler such that the precursor is at least partly evaporated and supplied to said gas inlet 18 by means of said pipe 3. The heater 4 of the first bubbler 2 is configured to heat the precursor to more than about 90° C. In another embodiment, the heater 4 of the bubbler 2 is configured to heat the precursor to more than about 140° C.

Furthermore, the apparatus comprises at least one pipeline heater 9 which is in thermal contact to at least a part of said pipe 3. The pipeline heater 9 is adapted to heat the pipe 3 to more than about 90° C. in one embodiment. In another embodiment, the pipeline heater is adapted to heat the pipe to more than about 140° C. Thus, the structure of the first bubbler 2 substantially corresponds to that of a gas washing bottle. Inside the bubbler 2, a saturated vapor of the first precursor is formed above the liquid or solid material of the first precursor. When a carrier gas is supplied to the inlet of the bubbler, said carrier gas flows through the bubbler 2 to its outlet. The metal-organic compound is transported by the carrier gas through the outlet and into the reaction chamber where the semiconductor layer growth takes place on the substrate 20. In some embodiments of the invention, the carrier gas may be selected from hydrogen or nitrogen or an inert gas, e.g. a noble gas.

These features of the first bubbler 2 described above provide a molar flow of more than about $1 \cdot 10^{-6}$ mol/min of the first precursor which allows for the production of semiconductor layers of high crystal quality and a high $M^2$ content (1−a) of more than about 0.01 or more than about 0.05 or more than about 0.1 or more than about 0.2 or more than about 0.3.

In the illustrated exemplary embodiments, the bubbler 2 holds $Cp_3Sc$ as the first precursor for supplying scandium as element $M^2$ in the semiconductor layer. However, other first precursors for $M^2$ may also be used in the bubbler 2, as described above.

In some embodiments of the invention, the first bubbler 2 containing the first precursor for $M^2$ is heated to a temperature of more than about 90° C. In other embodiments of the invention, the first bubbler 2 containing the first precursor can be heated to a temperature ranging from about 120° C. to about 200° C. In still another embodiment of the invention, the first bubbler 2 containing the first precursor can be heated to a temperature ranging from about 150° C. to about 200° C. In still another embodiment of the invention, the first bubbler 2 containing the first precursor can be heated to a temperature ranging from about 150° C. to about 175° C. The temperature ranges disclosed allow for a molar flow of more than $10^{-6}$ mol/min, which in turn allows to incorporate the large amounts of $M^2$ into the semiconductor layer needed to deposit the semiconductor layers described above. The heater 4 may comprise an electrical resistance heater, an induction heater or a water or glycol or oil bath.

A carrier gas, for example hydrogen or nitrogen or a noble gas, is supplied to the inlet of the first bubbler 2 via a supply line 7. The amount of carrier gas may be selected from the range including about 1 slm up to about 15 slm. In other embodiments, the amount of carrier gas may be selected from the range including about 1 slm up to about 6 slm. (standard liters per minute, wherein in SI units:

$$1 \text{ slm} = 1.68875 \frac{Pa \cdot m^3}{s}$$

applies. The amount of carrier gas may be controlled by a third mass flow controller 8. The pressure of the carrier gas in the supply line 7 may be about 1 bar. The carrier gas is supplied through the supply line 7 into the bubbler 2 with the first precursor, so that the precursor is expelled from the bubbler 2 through the pipe 3 and supplied into the reaction chamber 1 via the gas inlet 18.

According to the invention, the pipe 3 coupling the outlet of the first bubbler to the gas inlet 18 of the reaction chamber 1 is in thermal contact to at least one pipeline heater 9. In some embodiments of the invention, the carrier gas in the supply line 7 is in thermal contact with a second pipeline heater 71. Both pipeline heaters are configured to bring the pipe 3 and/or the supply line 7 to an elevated temperature. Both pipeline heaters may comprise any of an induction heater or a resistance heater. A resistance heater may have a heating wire running parallel to the line or pipe. In other embodiments, heat may be provided by an electric current flowing directly through the metallic wall of the pipe 3 or the line 7. The pipe 3 and the supply line 7 may be brought to a temperature which corresponds approximately to the temperature of the bubbler 2 or which is selected up to approx. 50° C. higher. The first pipeline heater 9 may optionally also heat the pressure gauge 5 and the optional valve 6. This prevents or reduces undesired condensation of the first precursor in the pipe 3.

The pipe 3 may be provided with a pressure gauge 5, which is used to determine the total pressure in the pipe 3 which should substantially correspond to the total pressure within the first bubbler 2. The pressure gauge 5 may be a operational independent of the gas type, for example a capacitive manometer or a spring manometer. Such a pressure gauge 5 may be a mechanical component that is operable faultlessly even at elevated temperatures up to 150° C. or up to 200° C. The pressure in the pipe 3 and thus within the bubbler 2 may be controlled to be in the range from 0.15 bar to 0.3 bar or in the range from 0.17 bar to 0.26 bar. This valve may also be a needle or metering valve, which can be regulated manually or with other methods (electrically, by pneumatic air, or any other suitable method). Thanks to such valve, the total flow of the gas mixture (precursor and carrier gas) can be controlled in a reproducible way.

In some embodiments, the pipe 3 may have an optional check valve 6, which avoids other gases, e.g. carrier gas and/or other precursors, to flow back from the reaction chamber 1 into the pipe 3. Such a check valve 6 may be a mechanical valve which, in contrast to electronic pressure controllers, is operable faultlessly at elevated temperatures up to 150° C. or up to 200° C.

The molar flow $\dot{n}$ of the first precursor may be determined in some embodiments of the invention by the following formula:

$$\dot{n} = \frac{p_{total} \cdot \dot{V} \cdot \frac{p_{sc}}{p_{total}}}{R \cdot T}$$

wherein $\dot{V}$ denotes the flow of the carrier gas inside the carrier gas supply line 7, $p_{sc}$ the partial pressure of the first precursor inside the first bubbler 2, $p_{total}$ the total pressure within the first bubbler 2, T the temperature of the first bubbler 2 and R the universal gas constant. The temperature T of the first bubbler 2 and the flow $\dot{V}$ of the carrier gas may be measured and/or controlled by dedicated open-loop or closed-loop control devices not shown in the drawings. The total pressure $p_{total}$ can be measured, for example by a capacitive manometer or a spring manometer 5. The partial pressure $p_{sc}$ of the first precursor can be determined from the temperature T of the bubbler if the vapor pressure curve is known or has been determined for the precursor used. The vapor pressure curve can be determined experimentally in a way known per se or approximate data of a similar compound can be used. For example, the vapor pressure curve of $(MeCp)_3Y$ may be used even if the first bubbler 2 is filled with $(MeCp)_3Sc$ in order to deposit a semiconductor layer comprising $M^1_aSc_{1-a}N$.

In known apparatuses for MOCVD deposition, the use of electronic pressure controllers and/or mass flow controllers in the pipe coupling the outlet of the bubbler with the gas inlet 18 of the reaction chamber 1 is mandatory in order to have an accurate and reproducible control of the precursor quantity. These electronic pressure controllers and/or mass flow controllers do not withstand temperatures of more than 50° C. According to the invention, the features described above allow for the first time to operate a bubbler at temperatures of more than 50° C. without damaging pressure controllers or mass flow controllers in the pipe 3 due to excess temperatures. Thus, precursors with low vapor pressure such as $(MeCp)_3Sc$ are usable in an MOCVD method for the first time while still being able to control the flow allowing deposition of novel semiconductor layers.

Figure 9:
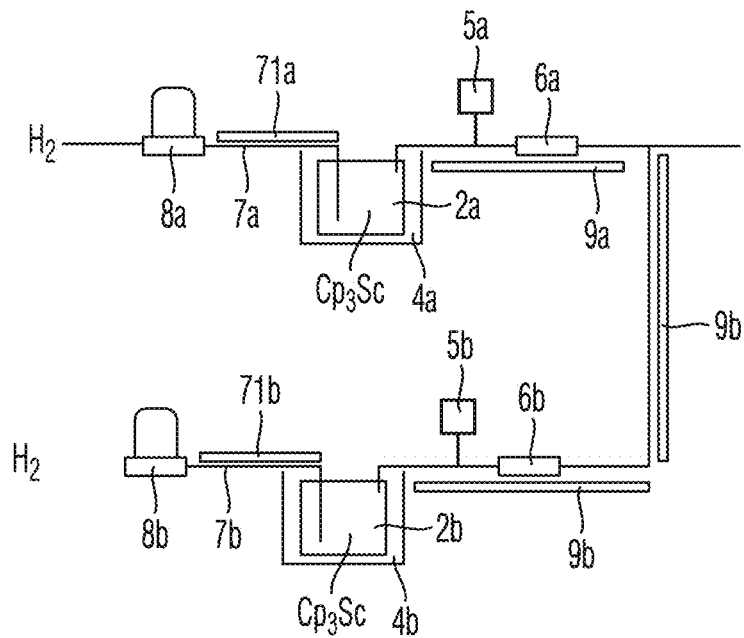
FIG. 9 illustrates a block diagram of an apparatus according to the invention in a second embodiment.

FIG. 9 illustrates a block diagram of a second embodiment of an apparatus according to the invention. Like features of the invention are marked with like reference numbers, so that the following description may be restricted to the main differences.

As may be seen in FIG. 9, the source of the first precursor comprising $M^2$ comprises a plurality of first bubblers 2a and 2b which may be operated simultaneously and in parallel. The example illustrated in the drawing comprises just two first bubblers 2a and 2b, each of which is supplied with carrier gas by means of a respective supply line 7a and 7b and each supply line having its own mass flow controller 8a and 8b assigned. Said mass flow controllers 8a and 8b are located at a location of the supply line 7 not being heated by the second pipeline heater 71. These optional second pipeline heaters 71a and 71b are in thermal contact with the carrier gas supply line 7 downstream of the mass flow controllers 8a and 8b.

Each of the bubbler 2a and 2b has a separate temperature control by means of the heaters 4a and 4b. This feature may allow a precise control of the molar flow of the first precursor supplied by each of the first bubblers.

In some embodiments of the invention, the number of bubblers operated in parallel may also be greater than 2 and may be between 2 and about 15 or between 2 and about 10 or between 2 and 6.

In some embodiments of the invention, a plurality of first bubblers 2 may share a common infrastructure. As an example, a plurality of first bubblers 2 may be disposed in a single heater 4 or be carrier gas may be supplied to a plurality of first bubblers 2 from a single carrier gas supply line 7.

Figure 10:
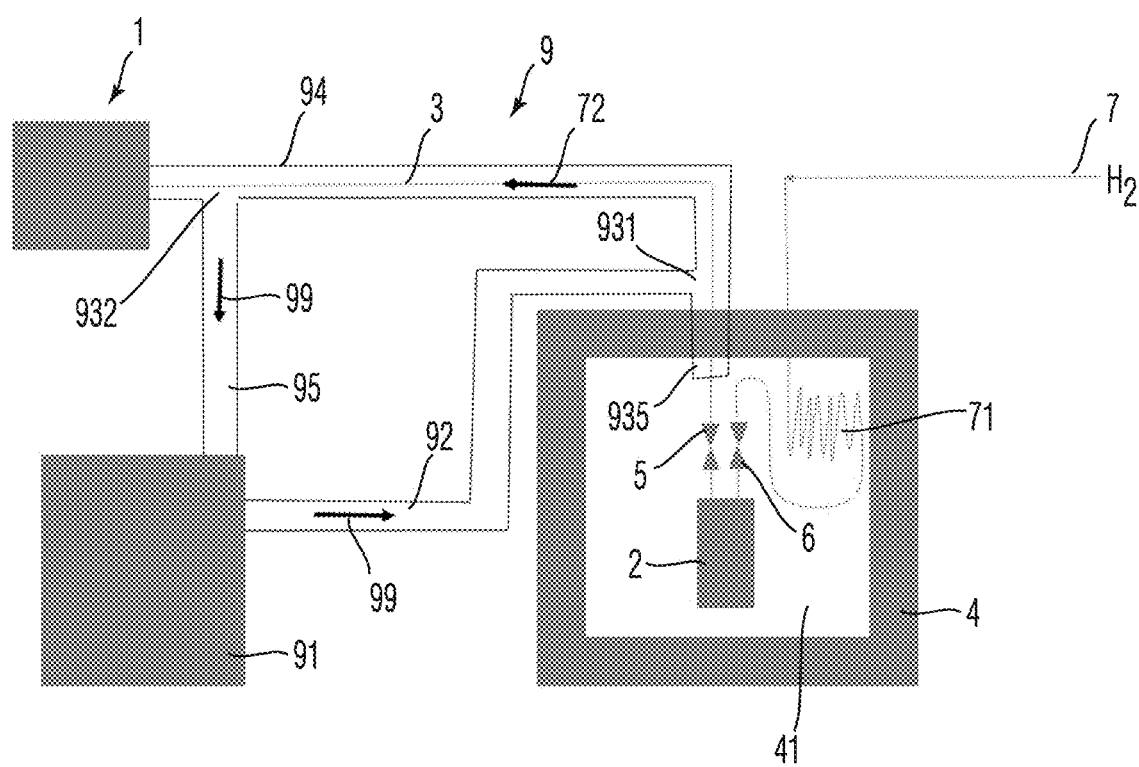
FIG. 10 illustrates a block diagram of an apparatus according to the invention in a third embodiment.

FIG. 10 illustrates a block diagram of a third embodiment of an apparatus according to the invention. Like features of the invention are marked with like reference numbers, so that the following description may be restricted to the main differences.

The sources or bubblers for the second and third precursor, which may be implemented in the same way as shown in FIG. 8, are not shown. The reaction chamber 1 is shown only schematically without repeating the features explained in connection with FIG. 8 again.

As may be seen in FIG. 10, the heater 4 for the first bubbler 2 is configured as a heating cabinet, the first bubbler 2 being located in the interior 41 of the heating cabinet. The heating cabinet may be heated by an electric heating device, by a hot gas supply or by a solid, liquid or gaseous fuel. The temperature in the interior 41 of the heating cabinet may be kept at a predeterminable setpoint by an open-loop or closed-loop control (not shown).

In some embodiments of the invention, an optional check valve 6 and/or an optional pressure gauge 5 or parts of a pressure gauge may be located inside the interior 41 of the heating cabinet in addition to the first bubbler 2 comprising the first precursor. Thus, the optional check valve 6 and/or the optional pressure gauge 5 are kept at the same temperature as the bubbler 2, so that the unwanted deposition or condensation of the first precursor in the check valve 6 and/or the pressure gauge 5 may be avoided.

A carrier gas, e.g. hydrogen, is supplied to the first bubbler 2 via a supply line 7 and an optional mass flow controller located outside the heating cabinet and not shown in the drawing. A first longitudinal section of the supply line 7 running outside the interior 41 of the heating cabinet is substantially at room temperature, so that a known mass flow controller may be used to control the gas supply of the carrier gas and handling may be facilitated.

The second pipeline heater 71 being used to heat the carrier gas inside the supply line 7 is designed in the form of a pipe coil of a second longitudinal section of the supply line 7. In other embodiments, any other type of heat exchanger may be used. The pipe coil or heat exchanger is located in the interior 41 of the heating cabinet. This feature may ensures in a simple way that the temperature of the carrier gas supplied corresponds substantially to the temperature of the first precursor in the first bubbler 2.

The first precursor leaves the bubbler 2 together with the carrier gas via the pipe 3, as described above in connection with the first embodiment and illustrated by the flow arrow 72.

In contrast to the first embodiment, the first pipeline heater 9 is designed as an outer pipeline 94 surrounding said pipe 3 and comprising a heat transfer liquid 99 filling the gap between the outer pipeline 94 and the pipe 3. This heat transfer liquid 99 is circulated when the apparatus is in operation. As the pipe 3 is arranged approximately concentrically to the outer pipeline 94 the heat transfer liquid may flow in the gap and may heat the pipe 3 homogeneously. This ensures a uniform temperature profile of the line even if the pipe 3 is made of a material of poor thermal conductivity, such as glass or plastics or stainless steel or ceramics. Both the pipe 3 for the precursor and the outer pipeline 94 of the heat transfer fluid may be designed as a rigid pipe or as a flexible tube or in different designs in different sections.

During the operation of the apparatus, heat is generated by a heat generating device 91 and supplied to the heat transfer liquid 99. The heat generating device 91 may comprise an optional pump as well to circulate the heat transfer liquid 99. The heat transfer liquid 99 leaves the heat generating device 91 through a heat transfer liquid supply line 92. The temperature of the heat transfer liquid 99 may be selected such that the temperature of the pipe 3 is approximately equal to or higher than the temperature of the bubbler 2.

In some embodiments of the invention, the heat transfer liquid 99 may be selected from any of water or steam or a thermal oil or a gas. In some embodiments of the invention, the heat transfer liquid 99 may be circulated at least inside the outer pipeline 94 at a pressure of about 950 mbar to about 1300 mbar. A higher pressure may raise the boiling point of the heat transfer liquid 99 so that higher operating temperatures may be reached during operation with environmentally safe heat transfer liquids 99 such as water.

The heat transfer liquid supply line 92 leads to a first T-piece 931 having three connectors. One connector of said T-piece 931 leads by means of a short longitudinal section 935 into the interior 41 of the heating cabinet so that no thermal bridge is created at the point where the pipe 3 enters the outer pipeline 94. The outer pipeline 94 is extending from the connection of the first T-piece 931 opposite to the short longitudinal section 935. It should be noted that the first T-piece 931 may also be arranged inside the interior 41 of the heating cabinet in some embodiments. In these embodiments, the short longitudinal section 935 may be omitted or the T-piece 931 may be designed as a 90° elbow into which the pipe 3 is inserted through a hole in the wall.

The third embodiment comprises further a second T-piece 932 being located close to the gas inlet 18 of the reaction chamber 1. The pipe 3 is guided through this second T-piece 932 substantially in a straight line. A return line 95 begins at the branching connection of the second T-piece 932, through which the heat transfer medium 99 is returned to the heat generating device 91. Details of the inside of the reaction chamber 1 may be best seen in FIG. 8.

Of course, the invention is not limited to the illustrated embodiments. Therefore, the above description should not be considered limiting but explanatory. The below claims should be understood in such a way that a described feature is available in at least one exemplary embodiment. This does not rule out the presence of further features. If the claims and the above description define "first" and "second" embodiments, this designation serves to distinguish between two similar embodiments without determining an order.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature may not be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The foregoing description and accompanying drawings illustrate the principles, exemplary embodiments, and modes of operation of the systems, apparatuses, and methods. However, the systems, apparatuses, and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments may be made by those skilled in the art without departing from the scope of the systems, apparatuses, and methods as defined by the following claims.

What is claimed is:

1. An apparatus for manufacturing at least one semiconductor layer on at least one substrate by metal organic chemical vapour deposition (MOCVD), said apparatus comprising:
   a reaction chamber,
   at least one heatable substrate holder located inside the reaction chamber,
   a gas inlet connected to the reaction chamber,
   a header line coupled to the gas inlet to the reaction chamber,
   a first bubbler configured to accommodate a first precursor, the first bubbler having an inlet and an outlet and a heater, wherein the outlet of the first bubbler is coupled to the header line by means of a first pipe, wherein said first pipe is in thermal contact with at least one pipeline heater,
   a first mass flow controller coupled to the inlet of the first bubbler and configured to control a flow of a carrier gas to the inlet of the first bubbler,
   a pressure gauge arranged in the first pipe and configured to measure a total pressure within the first pipe resulting from evaporated first precursor mixed with the carrier gas,
   a second bubbler configured to accommodate a second precursor, the second bubbler having an inlet and an outlet, wherein a carrier gas of the same species with the carrier gas is also supplied to the second bubbler via the inlet of the second bubbler, and the outlet of the second bubbler is coupled to the header line via a second pipe, and
   wherein the header line couples both the first pipe and the second pipe to the gas inlet to the reaction chamber, and includes at least one switch valve for selectively temporarily exhausting to an exhaust gas line the evaporated first precursor mixed with the carrier gas in the first pipe or the evaporated second precursor mixed with the carrier gas in the second pipe.

2. The apparatus of claim 1, comprising further a carrier gas supply line being coupled to the inlet of said first bubbler and being in thermal contact with at least one other pipeline heater.

3. The apparatus of claim 2, wherein the first mass flow controller is arranged in the carrier gas supply line at a location not in thermal contact with the at least one other pipeline heater.

4. The apparatus of claim 1, comprising further a check valve being arranged in the first pipe coupling the outlet of the first bubbler to said header line.

5. The apparatus of claim 1, wherein said heater comprises any of a heat bath comprising a heat transfer medium or a heating cabinet, the interior of which is adapted to receive the bubbler.

6. The apparatus of claim 1, comprising further a gas inlet heater being in thermal contact with said gas inlet.

7. The apparatus of claim 1, wherein the at least one first pipeline heater is selected from any of a resistance heater being in thermal contact with any of the first pipe and a carrier gas supply line or an outer pipeline surrounding any of the first pipe or the carrier gas supply line and comprising a heat transfer liquid filling the gap between the outer pipeline and the first pipe or the gap between the outer pipeline and the carrier gas supply line.

8. The apparatus of claim 7, comprising further a pump being configured to pump said heat transfer liquid through the gap between the outer pipeline and the first pipe or the gap between the outer pipeline and the carrier gas supply line respectively.

* * * * *